United States Patent
Aoyama

(10) Patent No.: US 7,336,754 B2
(45) Date of Patent: Feb. 26, 2008

(54) CLOCK AND DATA RECOVERY CIRCUIT

(75) Inventor: Morishige Aoyama, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 675 days.

(21) Appl. No.: 10/861,355

(22) Filed: Jun. 7, 2004

(65) Prior Publication Data

US 2004/0252804 A1 Dec. 16, 2004

(30) Foreign Application Priority Data

Jun. 11, 2003 (JP) .............................. 2003-166712

(51) Int. Cl.
*H03D 3/24* (2006.01)
(52) U.S. Cl. ..................................... 375/376
(58) Field of Classification Search ................ 375/354, 375/373, 374, 375, 376; 327/236, 237, 241, 327/244
See application file for complete search history.

(56) References Cited

U.S. PATENT DOCUMENTS

| 6,900,676 B1 * | 5/2005 | Tamura ....................... 327/156 |
| 6,937,685 B2 * | 8/2005 | Tang ........................... 375/376 |
| 2004/0009759 A1 * | 1/2004 | Mayor et al. ................ 455/258 |

FOREIGN PATENT DOCUMENTS

JP 2001-136062 5/2001
JP 2002-190724 7/2002

OTHER PUBLICATIONS

Mitsutoshi Sugawara, et al., "1.5 Gbps. 5150 ppm Spread Spectrum SerDes PHY with a 0.3 mW. 1.5 Gbps Level Detector for Serial ATA", Symposium on VLSI Circuits Digest of Technical Papers, Jun. 2002.
Stefanos Sidiropoulos, et al., "A Semi-Digital DLL with Unlimited Phase Shift Capability and 0.08-400MHz Operating Range", ISSCC 1997, pp. 332-333.
"A 2B Parallel 1.25Gb/s Interconnect I/O Interface with Self-Configurable Link and Plesiochronous Clocking", ISSCC 1999, pp. 180-181.

* cited by examiner

*Primary Examiner*—Sam K. Ahn
(74) *Attorney, Agent, or Firm*—McGinn IP Law Group, PLLC

(57) ABSTRACT

A clock and data recovery circuit, for tracking frequency-modulated input data, comprises a phase detector for receiving a data signal and a synchronous clock signal, detecting a phase delay or a phase advance, and outputting an UP1/DOWN1 signal, first and second integrators for integrating the UP1/DOWN1 signal and outputting an UP2/DOWN2 signal and an UP3/DOWN3 signal, respectively, a pattern generator for receiving the UP3/DOWN3 signal from the second integrator to output an UP4/DOWN4 signal, a mixer for receiving the UP2/DOWN2 signal from the first integrator and the UP4/DOWN4 signal from the pattern generator and generating an UP5/DOWN5 signal for output, and a phase interpolator for interpolating the phase of an input clock signal based on the UP5/DOWN5 signal from the mixer, for output are provided. A clock signal output from the interpolator is fed back to the phase detector as the clock.

40 Claims, 13 Drawing Sheets

FIG. 8

| | | COUNTER VALUE | | | | | | | | | |
|---|---|---|---|---|---|---|---|---|---|---|---|
| | | 0 | 1 | 2 | 3 | 4 | 5 | 6 | 7 | 8 | 9 |
| UP/DOWN COUNTER VALUE | -10 | -1 | -1 | -1 | -1 | -1 | -1 | -1 | -1 | -1 | -1 |
| | -9 | -1 | -1 | -1 | -1 | -1 | 0 | -1 | -1 | -1 | -1 |
| | -8 | -1 | -1 | -1 | 0 | -1 | -1 | -1 | -1 | 0 | -1 |
| | -7 | -1 | -1 | 0 | -1 | -1 | 0 | -1 | -1 | 0 | -1 |
| | -6 | -1 | 0 | -1 | 0 | -1 | -1 | 0 | -1 | 0 | -1 |
| | -5 | -1 | 0 | -1 | 0 | -1 | 0 | -1 | 0 | -1 | 0 |
| | -4 | 0 | -1 | 0 | -1 | 0 | 0 | -1 | 0 | -1 | 0 |
| | -3 | 0 | 0 | -1 | 0 | 0 | -1 | 0 | 0 | -1 | 0 |
| | -2 | 0 | 0 | 0 | -1 | 0 | 0 | 0 | 0 | -1 | 0 |
| | -1 | 0 | 0 | 0 | 0 | 0 | -1 | 0 | 0 | 0 | 0 |
| | 0 | 0 | 0 | 0 | 0 | 0 | 0 | 0 | 0 | 0 | 0 |
| | 1 | 0 | 0 | 0 | 0 | 0 | +1 | 0 | 0 | 0 | 0 |
| | 2 | 0 | 0 | 0 | +1 | 0 | 0 | 0 | 0 | +1 | 0 |
| | 3 | 0 | 0 | +1 | 0 | 0 | +1 | 0 | 0 | +1 | 0 |
| | 4 | 0 | +1 | 0 | +1 | 0 | 0 | +1 | 0 | +1 | 0 |
| | 5 | 0 | +1 | 0 | +1 | 0 | +1 | 0 | +1 | 0 | +1 |
| | 6 | +1 | 0 | +1 | 0 | +1 | +1 | 0 | +1 | 0 | +1 |
| | 7 | +1 | +1 | 0 | +1 | +1 | 0 | +1 | +1 | 0 | +1 |
| | 8 | +1 | +1 | +1 | 0 | +1 | +1 | +1 | +1 | 0 | +1 |
| | 9 | +1 | +1 | +1 | +1 | +1 | 0 | +1 | +1 | +1 | +1 |
| | 10 | +1 | +1 | +1 | +1 | +1 | +1 | +1 | +1 | +1 | +1 |

FIG. 9

| UP2 | DOWN2 | UP4 | DOWN4 | UP5 | DOWN5 |
|---|---|---|---|---|---|
| 0 | 0 | 0 | 0 | 0 | 0 |
| 1 | 0 | 0 | 0 | 1 | 0 |
| 0 | 1 | 0 | 0 | 0 | 1 |
| 1 | 1 | 1 | 0 | 0 | 0 |
| 0 | 0 | 0 | 0 | 1 | 0 |
| 0 | 0 | 1 | 1 | 0 | 1 |
| 0 | 0 | 1 | 1 | 1 | 0 |
| 1 | 1 | 1 | 0 | 0 | 1 |
| 0 | 1 | 0 | 1 | 1 | 0 |
| 1 | 1 | 1 | 1 | 0 | 1 |
| 1 | 1 | 0 | 0 | 0 | 0 |
| 1 | 0 | 0 | 1 | 1 FOR TWO CONSECUTIVE CLOCKS | 1 FOR TWO CONSECUTIVE CLOCKS |
| 0 | 1 | 1 | 1 | 0 | 0 |
| 1 | 0 | 1 | 0 | 0 | 0 |
| 0 | 1 | 1 | 0 | 0 | 0 |

CLOCK AND DATA RECOVERY CIRCUIT

FIELD OF THE INVENTION

The present invention relates to a clock and data recovery circuit for generating a clock signal and data from input data.

BACKGROUND OF THE INVENTION

When a clock generator in an electronic device generates a single frequency, emission increases due to the frequency and harmonics. Thus, a spread spectrum clock signal for reducing electromagnetic interference by performing frequency modulation and thereby reducing peaks of unwanted emissions is employed. As an approach for extracting a clock signal from serial data frequency modulated using the spread spectrum clock, a clock and data recovery circuit as shown in FIG. 13 is known (refer to Non-patent Document 1, for example).

Referring to FIG. 13, in addition to a phase tracking loop constituted from a phase detector 201, an integrator 202, and a phase interpolator 206, a frequency tracking loop constituted from an integrator 203, a charge pump 214, a loop filter 215, a VCO (voltage controlled oscillator) 216, and the phase interpolator 206 is provided, so that a synchronous clock is made to track data frequency modulated using the spread spectrum clock. Further, for frequency initialization of the VCO 216, a frequency initialization loop constituted from a phase and frequency detector 211, a charge pump 212, the loop filter 215, and the VCO 216 is provided.

[Non-Patent Document 1]

"1.5 Gbps, 5150 ppm Spread Spectrum SerDes PHY with a 0.3 mW, 1.5 Gbps Level Detector for Serial ATA", Symposium on VLSI Circuits Digest of Technical Papers 5-3, FIG. 1, June/2002

[Non-Patent Document 2]

"A Semi-Digital DLL with Unlimited Phase Shift Capability and 0.08-400 MHz Operating Range", FIG. 4 ISSCC 1997 p.p. 332-333

[Non-Patent Document 3]

"A 2B Parallel 1.25 Gb/s Interconnect I/O Interface with Self-Configurable Link and Plesiochronous Clocking", FIG. 10.3.5(a) ISSCC 1999 p.p. 180-181

[Patent Document 1]

JP Patent Kokai Publication No. JP-P2001-136062A (FIG. 1, pp. 4 and 5)

[Patent Document 2]

JP Patent Kokai Publication No. JP-P2002-190724A (FIGS. 6, 7, 8, 9, pp. 9 and 10)

SUMMARY OF THE DISCLOSURE

However, it is difficult for the clock and data recovery circuit that does not include the integrator 203, charge pump 214, loop filter 215, and VCO 216 constituting the frequency tracking loop in FIG. 13 to track the phase of serial data frequency modulated using the spread spectrum clock, as described below. The clock and data recovery circuit constituted from the phase detector 201, integrator 202, and phase interpolator 206 can only track a frequency difference up to $1/(64 \times 4) = 0.39\%$ when the resolution of the phase interpolator 206 is set to 1/64 and the integrator 202 is constituted from an up/down counter with a range of plus or minus four.

On the other hand, in the serial ATA system, tracking of 0.5% frequency modulation is required.

The clock and data recovery circuit having the frequency tracking loop including the charge pump 214, loop filter 215, and VCO 216 can be configured to track frequency modulation exceeding 0.5%. However, when the clock and data recovery circuit is made to have a multi-channel configuration, the chip size and power consumption increases. It means that when the clock and data recovery circuit having the frequency tracking loop including the charge pump, loop filter, and VCO (voltage controlled oscillator) is made to have the multi-channel configuration, all channels will be equipped with frequency tracking loops each including the charge pump, loop filter, and VCO, thereby increasing the chip size. Then, if high-speed VCOs are provided for all channels in a high-speed system of 1 Gbps or higher, for example, power consumption will increase.

Accordingly, it is an object of the present invention to provide a clock and recovery circuit with a reduced circuit size, which can track frequency-modulated input data while effecting reduction in chip size and reduction in power consumption.

The inventor of the present invention, as a result of having made an intensive study to solve the problems described before, has found that, by disposing a phase interpolator for adjusting the phase of an output clock signal based on a control signal, providing in a frequency tracking loop a pattern generator for generating a control signal for frequency tracking as necessary based on the result of phase comparison and synthesizing an up/down signal of a phase tracking loop and an up/down signal from the pattern generator in the frequency tracking loop to supply the synthesized signal to the phase interpolator as a control signal, a clock and data recovery circuit with a reduced circuit size can be implemented without using a VCO.

The above and other objects are attained by a clock and data recovery circuit in accordance with one aspect of the present invention, wherein a frequency tracking loop and a phase tracking loop share:

a phase detector for comparing the phase of an input data signal with the phase of a synchronous clock signal; and a phase interpolator for receiving an input clock signal and a control signal, adjusting the phase of an output clock signal based on the control signal, and supplying the output clock to the phase detector as the synchronous clock; and the frequency tracking loop includes: a pattern generator for generating a signal for variably setting the phase of the output clock signal from the phase interpolator based on the result of phase comparison by the phase detector, for output; and the clock and data recovery circuit includes:

means for generating the control signal to the phase interpolator based on the result of phase detection by the phase tracking loop and the output of the pattern generator in the frequency tracking loop.

A clock and data recovery circuit according to another aspect of the present invention includes:

a phase detector for comparing the phase of a synchronous clock signal with the phase of a data signal to output a result of phase comparison; and a phase interpolator for receiving an input clock signal and a control signal to variably adjust the phase of an output clock signal;

wherein a frequency tracking loop includes a pattern generator for receiving the integrated value of the result of the phase comparison from the phase detector and then generating a signal for variably setting the phase of the output clock signal from the phase interpolator and outputting the generated signal;

the clock and data recovery circuit further includes: a mixer for generating a signal mixing the integrated value in a phase tracking loop with the output of the pattern generator in the frequency tracking loop, the phase tracking loop controlling the phase of the output clock signal from the phase interpolator according to the integrated value of the result of the phase comparison by the phase detector;

the signal generated by the mixer is supplied to the phase interpolator as the control signal; and the output clock signal from the phase interpolator is feedback to the phase detector as the synchronous clock signal.

In the present invention, the phase tracking loop and the frequency tracking loop may share one integrator for integrating the result of the phase comparison by the phase detector.

In the present invention, when one of the phase tracking loop and the frequency tracking loop shows a stabilized state, the mixer may output a control signal for adjusting the phase of the output clock signal of the phase interpolator based on the result of the phase comparison by the other loop.

In the present invention, the mixer may include means for outputting a control signal for advancing the phase of the output clock signal of the phase interpolator for predetermined consecutive clocks when the result of the phase comparison in the phase tracking loop and the output of the pattern generator in the frequency tracking loop both indicate up, and outputting a control signal for delaying the phase of the output clock signal of the phase interpolator for predetermined consecutive clocks when the result of the phase comparison in the phase tracking loop and the output of the pattern generator in the frequency tracking loop both indicate down.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 8 is a diagram showing a configuration and an operation of a decoder in the pattern generator in the embodiment of the present invention in tabular form;

FIG. 9 is a table for explaining a configuration and an operation of a mixer in the embodiment of the present invention;

PREFERRED EMBODIMENTS OF THE INVENTION

Figure 1:
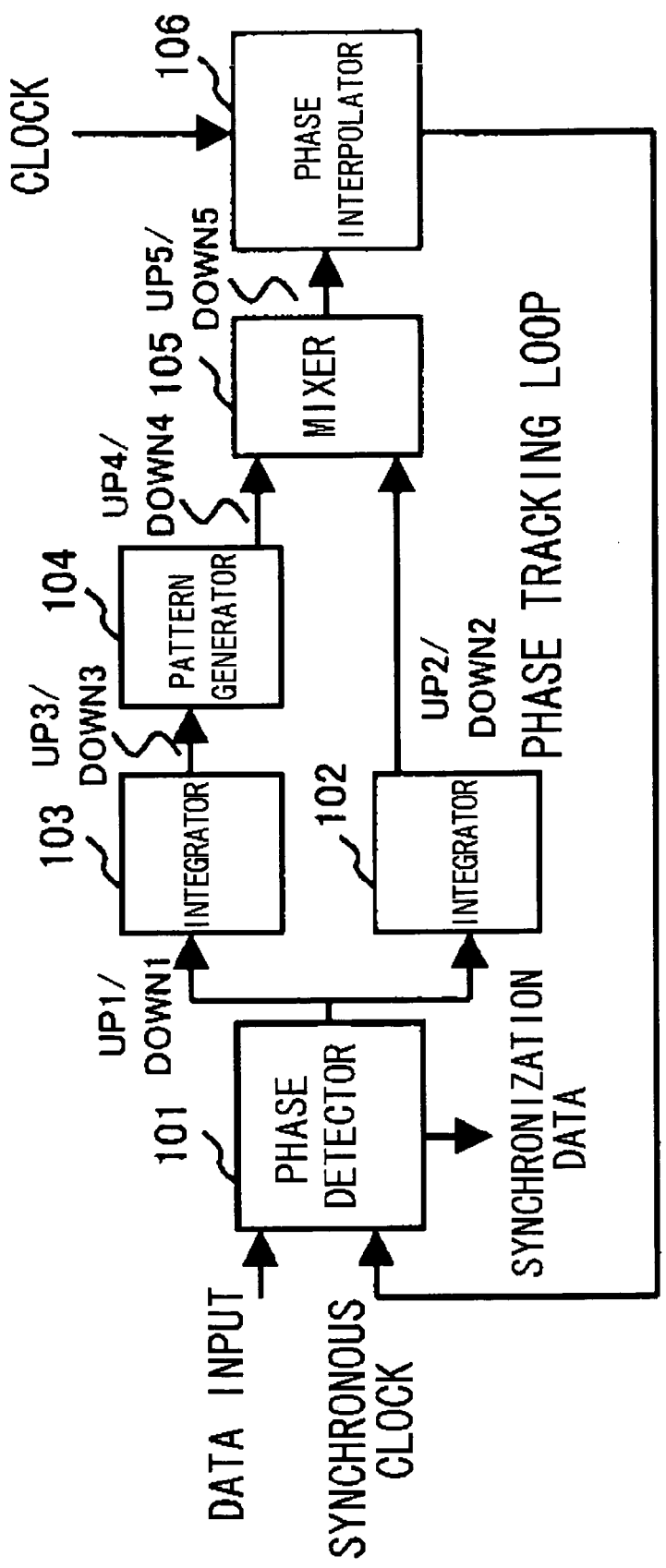
FIG. 1 is a diagram showing a configuration of an embodiment of the present invention.

Embodiment modes of the present invention will be described. A device according to a preferred embodiment of the present invention includes a phase detector (101), a first integrator (102), a second integrator (103), a pattern generator (104), a mixer (105), and a phase interpolator (106). The phase detector (101) receives a data signal and a synchronous clock signal, detects a delay or an advance between the phases of the two input signals, and then outputs a first control signal (UP1/DOWN1), according to the result of detection. The first integrator (102) integrates the first control signal output from the phase detector (101) to output a second control signal (UP2/DOWN2). The second integrator (103) integrates the first control signal (UP1/DOWN1) output from the phase detector (101) to output a third control signal. The pattern generator (104) inputs the third control signal (UP3/DOWN3) from the second integrator (103) and then outputs a fourth control signal. The mixer (105) receives the second control signal (UP2/DOWN2) from the first integrator (102) and the fourth control signal (UP4/DOWN4) from the pattern generator (104) and then generates a fifth control signal (UP5/DOWN5), for output. The phase interpolator (106) interpolates the phase of an input clock signal based on the fifth control signal (UP5/DOWN5) from the mixer (105) to adjust the phase of an output clock signal. The clock signal output from the phase interpolator (106) is fed back to the phase detector (101) as the synchronous clock signal. The clock signal supplied to the phase interpolator (106) may be a spread spectrum clock signal, or a clock signal of a constant frequency may be supplied. According to the embodiment mode configuration of the present invention described above, a clock and data recovery circuit for serial data that has undergone frequency modulation of 0.5% or higher defined by the serial ATA using the spread spectrum clock signal, for example, is implemented through control of the phase interpolator, without using a VCO. A description will be given below, based on embodiments.

Embodiments

FIG. 1 is a diagram showing an embodiment of the present invention. Referring to FIG. 1, a phase detector 101 for receiving data and a synchronous clock, detecting a delay or advance in phase therebetween, and outputting a control signal UP1/DOWN1 for indicating the result of phase comparison, an integrator 102 for integrating the output of the phase detector 101 to output a control signal UP2/DOWN 2, an integrator 103 for integrating the control signal UP1/DOWN1 from the phase detector 101 to output a control signal UP3/DOWN3, a pattern generator 104 for receiving the control signal UP3/DOWN3 from the integrator 103 to output a control signal UP4/DOWN4, a mixer 105 for receiving the control signal UP2/DOWN2 from the integrator 102 and the output signal UP4/DOWN 4 from the pattern generator 104 to output a control signal UP5/DOWN 5, and a phase interpolator 106 for interpolating the phase of an input clock signal based on the signal UP5/DOWN 5 from the mixer 105 are provided. The output of the phase interpolator 106 is fed back to the phase detector 101. As the clock signal supplied to the phase interpolator (106), a spread spectrum clock generated by a spread spectrum clock generator not shown may be input, or a clock of a fixed frequency generated by a multiplier PLL or the like not shown may be input.

In this embodiment a phase tracking loop for controlling the phase of the phase interpolator 106 according to the result of phase comparison between the synchronous clock signal and the input data signal, and the pattern generator 104 for generating the control signal for shifting the phase for the phase interpolator at a substantially constant interval and the integrator 103 for controlling the generation interval of the output signal of the pattern generator 104 according to integration of the result of phase comparison between the synchronous clock signal and the input data signal are provided for a frequency tracking loop therein. A clock and data recovery circuit for serial data that has undergone frequency modulation exceeding 0.5% using the spread spectrum clock is implemented by control of the phase interpolator 106, without using a VCO.

According to this embodiment, the clock signal synchronized with the serial data frequency modulated using the spread spectrum clock as a measure against EMI can be recovered. Further, in the case of a multi-channel configuration, there is no need to have the VCO for each of channels, and the clock signal can be supplied to each of the channels from a clock generating source (such as a PLL or a synthesizer) in a common block, which contributes to reduction in power consumption and reduction in chip size.

An operation of the embodiment shown in FIG. 1 will be described. The phase detector 101 compares the phase of input data signal with the phase of the synchronous clock signal, and outputs the UP1/DOWN 1 signal indicating whether the synchronous clock signal is ahead of or behind an input clock signal.

The UP1/DOWN1 signal is averaged by the integrator 102, from which the UP2/DOWN2 signal is output, the phase of the clock signal is corrected by the phase interpolator 106 through the mixer 105, and phase control is performed so as to make the phase of the synchronous clock closer to the phase of the input data signal. The integrators 102 and 103 are constituted from up/down counters, each performing up-counting on reception of the UP1 signal output from the phase detector 101, and down-counting on reception of the DOWN 1 signal output from the phase detector 101.

When the data rate of the data signal supplied to the phase detector 101 and the frequency of the synchronous clock signal are equal, the phase tracking loop for performing phase alignment of both should only function.

When the data rate of the input data signal supplied to the phase detector 101 and the frequency of the synchronous clock signal are different, the frequency tracking loop operates. When the data rate of the input data signal becomes slower than the frequency of the synchronous clock signal, the phase detector 101 activates the DOWN1 signal, the integrator 102 generates the DOWN2 signal obtained by integration of the DOWN1 signal, thus delaying the phase of the output clock (synchronous clock) of the phase interpolator 106.

When the frequency difference is such that even if the phase of the synchronous clock signal is delayed, the data rate of the input data signal supplied to the phase detector 101 does not become equal to the frequency of the synchronous clock signal, the DOWN1 signal continues as the output of the phase detector 101 (the DOWN1 is set to the logic 1 for a plurality of clock cycles), so that the integrator 103 outputs the DOWN3 signal. Upon reception of the DOWN3 signal, the pattern generator 104 generates the (active) DOWN4 signal for frequency correction.

The pattern generator 104 performs control so as to increase the frequency of generation of the DOWN4 signal when the DOWN3 signal from the integrator 103 continues.

The DOWN4 signal from the pattern generator 104 and the DOWN2 signal from the integrator 102 are supplied to the mixer 105, which generates the DOWN5 signal for correcting the phase of the clock by the phase interpolator 106 based on the DOWN4 signal and the DOWN2 signal.

When the data rate of the input data signal is low and the outputs of the DOWN1 signal and the DOWN3 signal continue over several cycles, the frequency of generation of the DOWN4 signal and the frequency of generation of the DOWN5 signal increase, the delay of the synchronous clock signal output from the phase interpolator 106 increases, and for this reason, the frequency is brought down. Then, when the frequency of the synchronous clock signal has substantially become equal to the data rate of the input data signal, the frequencies of generation of the UP1 signal and the DOWN1 signal from the phase detector 101 are roughly balanced. Thus, the UP3/DOWN3 from the integrator 103 is not generated, bringing about a stabilized state.

On the other hand, when the data rate of the input data signal supplied to the phase detector 101 is high and outputs of the UP1 signal and the UP3 signal continue, the frequencies of generation of the UP4 and UP5 signals increase; and the frequency of the synchronous clock signal output from the phase interpolator 106 substantially increases. Then, when the frequency of the synchronous clock signal supplied to the phase detector 101 has substantially become equal to the data rate of the input data, the UP1 signal and the DOWN1 signal from the phase detector 101 are roughly balanced. Thus, the UP3/DOWN3 signal from the integrator 103 is not generated, bringing about the stabilized state.

As will be described later, the pattern generator 104 is constituted from a counter for repetitively counting values from 0 to M, an up/down counter for increasing or decreasing the value in the range between +N and −N according to the UP3/DOWN3 signal from the integrator 103, and a decoder.

Respective components will be described below.

Figure 2:
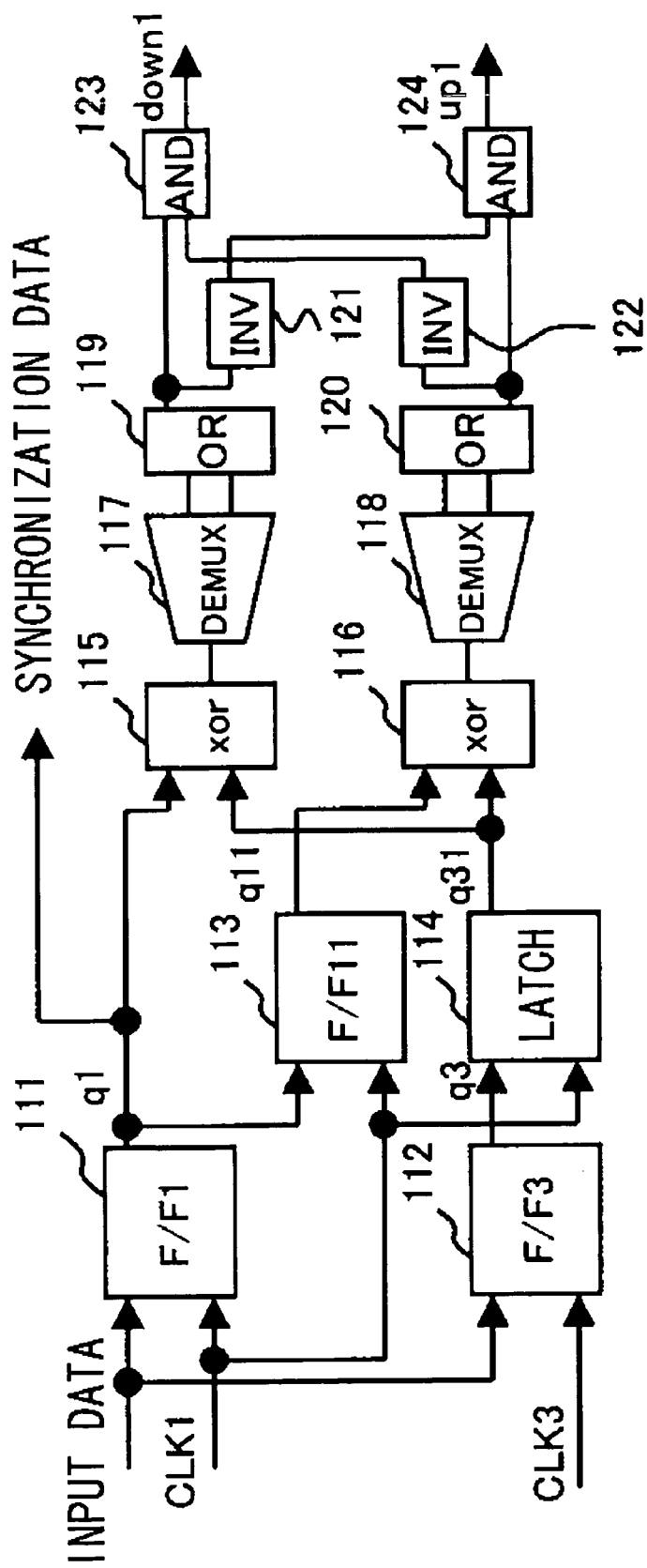
FIG. 2 is a diagram showing a configuration example of a phase detector in the embodiment of the present invention.

FIG. 2 is a diagram showing a configuration example of the phase detector 101. The configuration example is shown in which 1.5-Gbps data is received in response to two-phase clocks at 1.5 GHz. Referring to FIG. 2, the phase detector 101 includes a first flip-flop (FF1) 111, a second flip-flop (FF3) 112, a third flip-flop (FF11) 113, a latch (through latch) 114, a first exclusive OR (XOR) circuit 115, a second exclusive OR (XOR) circuit 116, first and second demultiplexers (DEMUX circuits) 117 and 118, a first OR circuit 119, a second OR circuit 120, a first AND circuit 123, and an AND circuit 124. The first flip-flop 111, which is an edge-triggered flip-flop, receives an input data signal at its data input terminal and receives a synchronous clock signal CLK1 at its clock terminal. The second flip-flop 112 receives the input data at its data input terminal and receives a clock signal CLK3 that is complementary to the synchronous clock signal CLK1 at its clock terminal. The third flip-flop 113 receives an output signal q1 from the first flip-flop 111 at its data input terminal and receives the clock signal CLK1 at its clock terminal. The latch 114 receives an output signal q3 from the second flip-flop 112 at its data input terminal and receives the clock signal CLK1 at its clock terminal. The first exclusive OR circuit 115 receives the output signal q1 from the first flip-flop 111 and an output signal q31 from the latch 114. The second exclusive OR circuit 116 receives an output signal q11 from the third flip-flop 113 and the output signal q31 from the latch 114. The first demultiplexer (DEMUX circuit) 117 and the second demultiplexer (DEMUX circuit) 118 serially receive the output signals of the first exclusive OR circuit 115 and the second exclusive OR circuit 116, respectively, for performing serial-to-parallel conversion and outputting the so converted signals in parallel. The first OR circuit 119 performs a logical OR operation of the outputs of the first and second demultiplexer 117. The second OR circuit 120 performs a logical OR operation of the outputs of the second demultiplexer 118. The first AND circuit 123 performs a logical AND operation of the output of the first OR circuit 119 and an output of an inverter 122 which receives and inverts the output of the second OR circuit 120 and outputs the so inverted signal. The second AND circuit 124 performs a logical OR operation of the output of the second OR circuit 120 and an output of an inverter 121 which receives and inverts the output of the first OR circuit 119 and outputs the so inverted signal. The output q1 of the first flip-flop (FF1) 111 is output for serving as a synchronized data signal.

Figure 3:
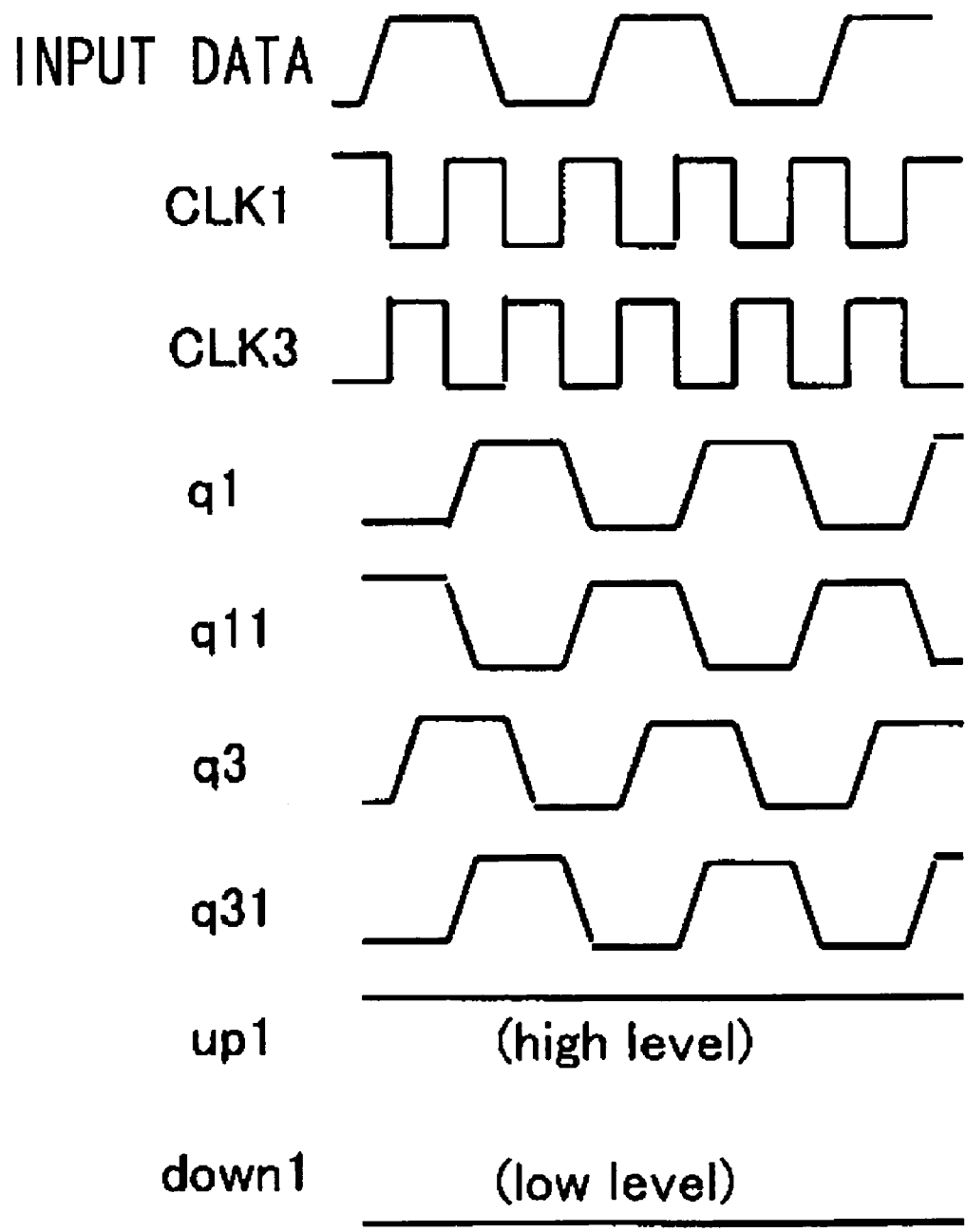
FIG. 3 is a timing diagram schematically showing an operation example of the phase detector in FIG. 2.
Figure 4:
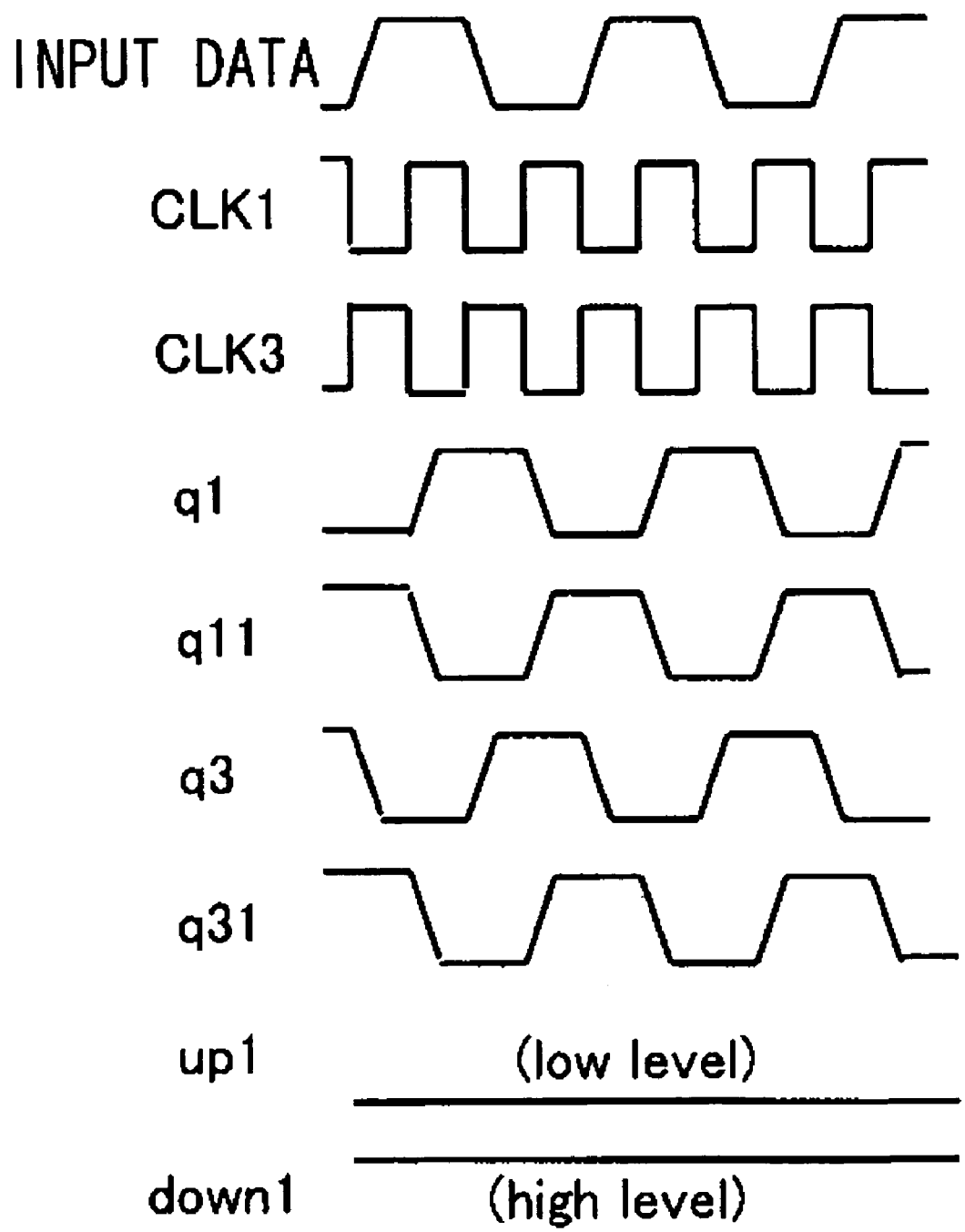
FIG. 4 is a timing diagram schematically showing another operation example of the phase detector in FIG. 2.

FIGS. 3 and 4 are timing diagrams showing examples of the timing operation of the phase detector 101 shown in FIG. 2. The case where the phase of input data signal is ahead of the phase of the synchronous clock signal is shown in FIG. 3, while the case where the phase of input data signal is delayed from the phase of the synchronous clock is shown in FIG. 4.

As shown in FIG. 3, when the change timing of the input data signal is between the rise of the CLK1 and the rise of the CLK3, the up1 signal of the first control signal becomes logic 1 (high), and the down1 signal becomes logic 0 (low).

On the other hand, as shown in FIG. 4, when the change timing of the input data signal is between the rise of the CLK3 and the rise of the CLK1, the up1 signal of the first control signal becomes logic 0 (low), while the down1 signal becomes logic 1 (high).

The first DEMUX circuit 117 and the second DEMUX circuit 118 for performing serial-to-parallel conversion are provided to cause the integrators 102 and 103, pattern generator 104, and mixer 105 which are disposed at subsequent stages of the phase detector 101 to operate in response to a clock slower in frequency than the clock signal CLK1. If the integrators 102 and 103, pattern generator 104, and mixer 105 are to be operated at the same frequency as that of the clock CLK1, the DEMUX circuits 117 and 118 are unnecessary. Incidentally, a PLL circuit is known in which phase difference signals (constituted from an up signal and a down signal) from a phase comparison circuit were supplied to a serial-to-parallel circuit (DEMUX circuit) to reduce the speeds of the phase difference signals, thereby improving an operation speed (refer to Patent Document 1, for example).

Figure 5:
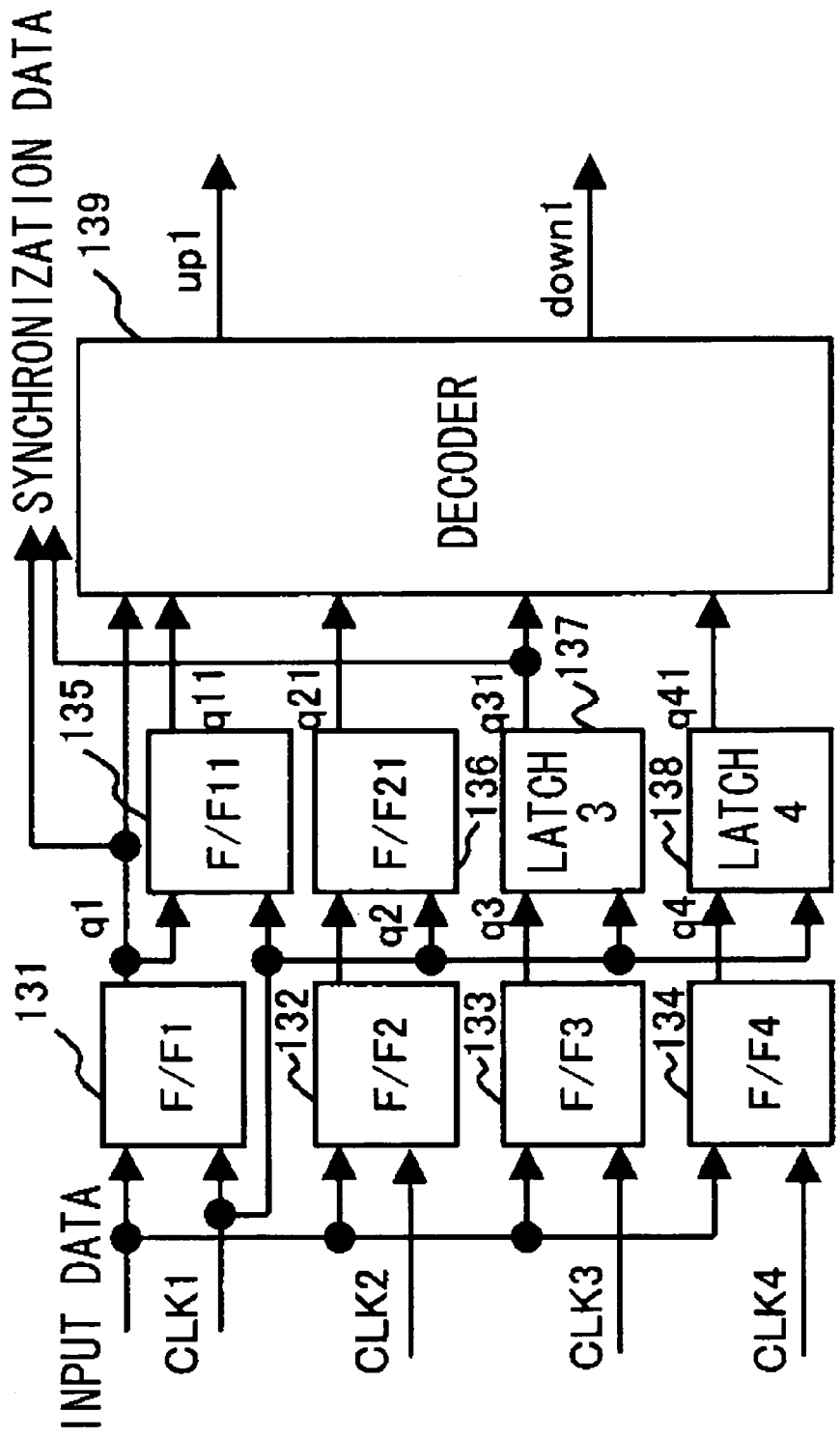
FIG. 5 is a diagram showing another configuration example of the phase detector in the embodiment of the present invention.

FIG. 5 is a diagram showing another configuration example of the phase detector 101. The configuration shown in FIG. 5 is applied to the case where 3-Gbps data is received in response to four-phase clocks at 1.5 GHz.

Four flip-flops 131 to 134 for receiving input data and four-phase clocks (four-phase synchronous clocks) CLK1 to CLK4 at their data input terminals and clock input terminals, respectively, are provided. Flip-flops 135 and 136 for sampling an output q1 of the flip-flop 131 and an output q2 of the flip-flop 132, respectively, in response to the clock CLK1 and latches 137 and 138 for sampling an output q3 of the flip-flop 133 and an output q4 of the flip-flop 134, respectively, in response to the clock CLK1 are provided. An output q11 of the flip-flop 135, an output q21 of the flip-flop 136, an output q31 of the latch 137, and an output q41 of the latch 138 are input for decoding, and the up signal up1 and the down signal down1 are output.

Figure 6:
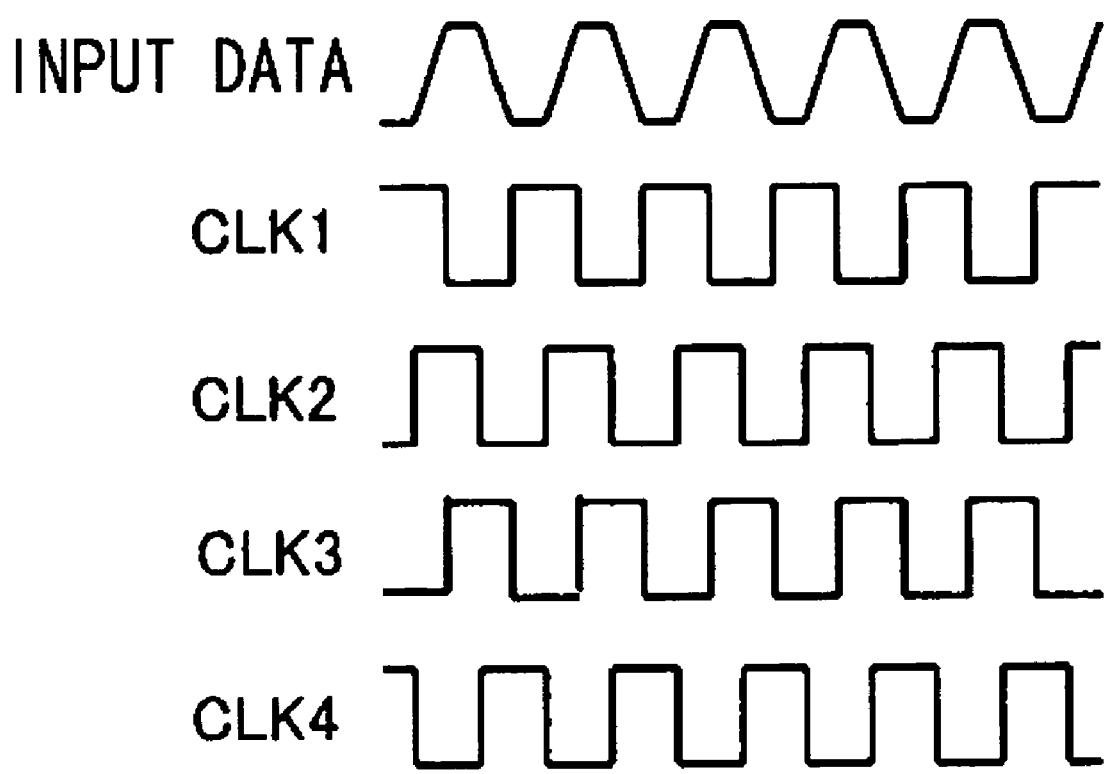
FIG. 6 is a timing diagram schematically showing an operation example of the phase detector in FIG. 5.

FIG. 6 is a timing diagram showing an example of the operation of the phase detector 101 shown in FIG. 5. Input data is sampled by the four flip-flops 131 to 134 at rising edges of the four-phase clocks CLK1 to CLK4 which are shifted in phase by 90 degrees, respectively, and the respective results of sampling are sampled by the flip-flops 135 and 136 and the latches 137 and 138 in response to the clock CLK1. A decoder 139 for receiving the results of sampling regards the pertinent clocks to be associated with a transition timing of the input data when adjacent sampling signals are different to each other, determines a delay or an advance in the phase of the input data, and outputs the up signal or the down signal. The q1 and the q31 are out put as synchronized data signals of two bits.

When the transition timing of the input data signal is
  between the rise of the first-phase clock signal CLK1 and
    the rise of the second-phase clock signal CLK2, or
  between the rise of the third-phase clock signal CLK3 and
    rise of the fourth-phase clock signal CLK4, the up
    signal up1 of the first control signal is set to the logic
    1.
When the transition timing of the input data is
  between the rise of the second-phase clock signal CLK2
    and the rise of the third-phase clock signal CLK3, or
  between the rise of the fourth-phase clock signal CLK4
    and the rise of the first-phase clock signal CLK1, the
    down signal down1 of the first control signal is set to
    the logic 1.

As in the configuration example shown in FIG. 2, by providing a DEMUX circuit (not shown) in the decoder 139, subsequent circuits can be operated at a frequency lower than the clock signal CLK1.

Next, the integrator 102 and the integrator 103 in FIG. 1 will be described. Each of the integrators 102 and 103 includes an up/down counter for incrementing a count value when the up signal up1 is the logic 1 and decrementing the count value when the down signal down1 is the logic 1.

As shown in FIG. 2, by providing the DEMUX circuits 117 and 118 (providing two-parallel outputs for one serial input) in the phase detector 101, the frequencies of clock signals supplied to the up/down counters (not shown) used in the integrators 102 and 103 become half of the frequency of the synchronous clock signal supplied to the phase detector 101.

When the count value of the integrator 103 is "63" and the up signal UP1 of the incoming first control signal is the logic 1, the integrator 103 outputs the up signal UP3 of the third control signal at the logic 1 in response to the next clock and sets the count value of the integrator 103 to "0" (auto-cleared). When the count value of the integrator 103 is "−63" and the down signal DOWN1 of the first control signal input is the logic 1, the integrator 103 outputs the down signal DOWN3 of the third control signal at the logic 1 in response to the next clock and sets the count value to "0"0 (auto-cleared).

When the count value of the integrator 102 is "4" and the up signal UP1 of the first control signal input is the logic 1, the integrator 102 outputs the up signal UP2 of the second control signal at logic 1 in response to the next clock, and sets the count value to "0". When the count value of the integrator 102 is "−4" and the down signal DOWN1 of the first control signal input is the logic 1, the integrator 102 outputs the down signal DOWN2 of the second control signal at the logic 1 in response to the next clock, and automatically clears the count value to "0".

Figure 7:
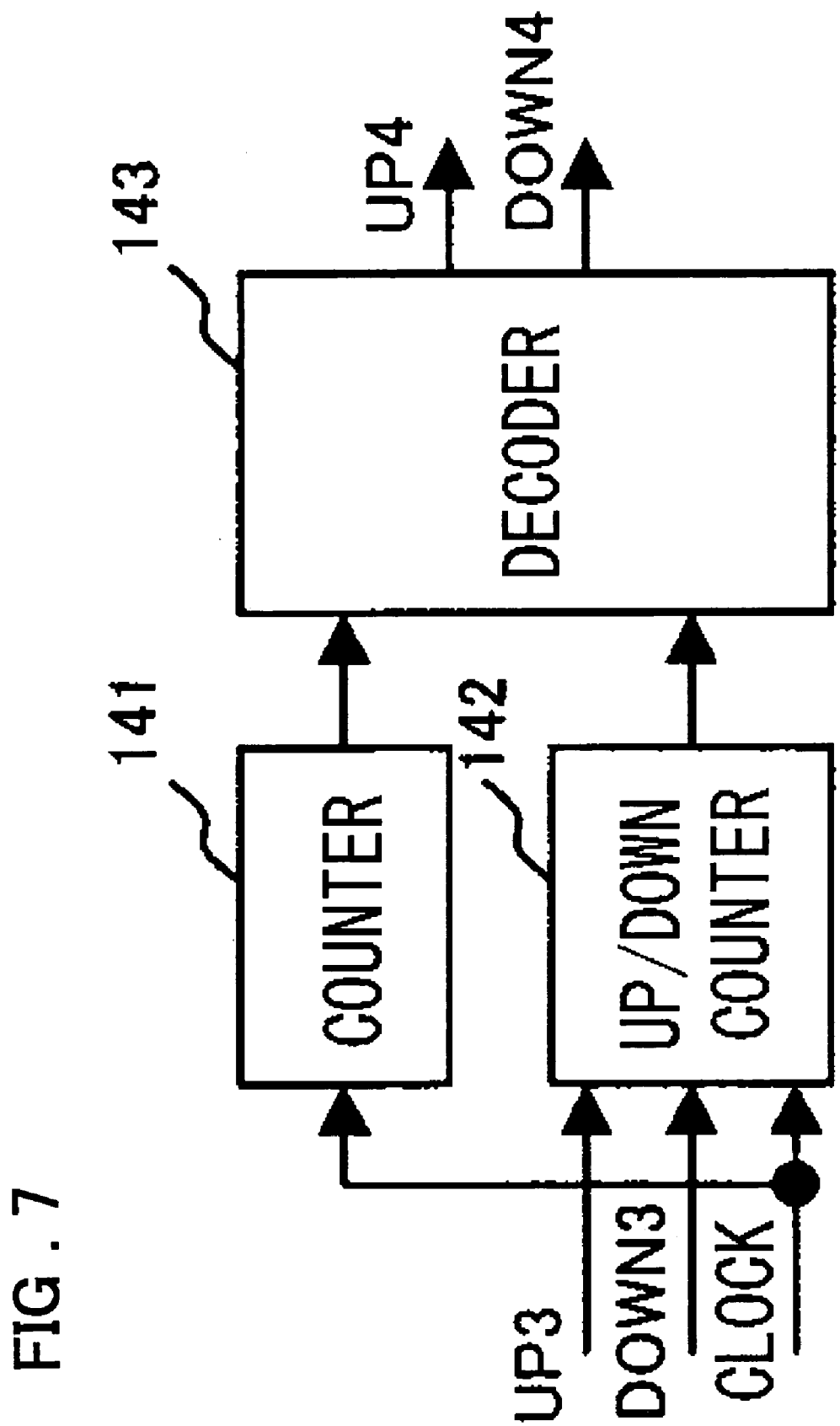
FIG. 7 is a diagram showing a configuration of a pattern generator according to the embodiment of the present invention.

Next, a specific example of the pattern generator 104 in FIG. 1 will be described. FIG. 7 is a diagram showing a configuration example of the pattern generator 104. Referring to FIG. 7, the pattern generator 104 includes a counter 141 for receiving the clock signal (synchronous clock signal), an up/down counter 142 for receiving the third control signal UP3/DOWN3 from the integrator 103 and receiving the clock signal(synchronous clock signal) to perform counting up or counting down, and a decoder 143 for receiving respective count values of the counter 141 and the counter 142 for decoding and outputting the fourth control signal UP4/DOWN4.

Preferably, the pattern length of the pattern generator 104 is larger than the maximum value of the up/down counter used in the integrator 102 for the phase tracking loop. In this embodiment, the pattern length is set to "10".

The counter 141 repetitively (cyclically) performs counting from "0" to "9" responsive to the every clock signal received according to the pattern length of "10".

When the up signal UP3 is logic 1, the up/down counter 142 increments (or counts up) the count value, and when the down signal DOWN3 is logic 1, the up/down counter 142 decrements (or counts down) the count value, within the value range from "−10" to "+10".

FIG. 8 is a truth value table for explaining a configuration and an operation of the decoder 143 in FIG. 7. FIG. 8 shows an example of the output values of the decoder 143 (for the UP4 and the DOWN 4) for the input values of the up/down counter 142 and the counter 141. Referring to FIG. 8, "−1" denotes the DOWN4 of the logic 1, "+1" denotes the UP4 of the logic 1, "0" denotes the DOWN4 of the logic 0 and the UP4 of the logic 0.

As shown in FIG. 8, the decoder 143
makes both of the up4 signal and the down4 signal of the fourth control signal the logic 0 when the count value of the up/down counter 142 is "0".
makes the UP4 signal the logic 1 n times for every 10 clocks corresponding to the pattern length, for example, when the count value of the up/down counter 142 is "+n".
makes the DOWN4 signal the logic 1 n times, for output, for every 10 clocks when the count value of the up/down counter 152 is "−n".
Further, the decoder 143
makes the UP4 signal the logic 1 when the count value of the up/down counter 142 is "+1" and the count value of the counter 141 is "5".
makes the UP4 signal the logic 1 when the count value of the up/down counter 142 is "+2" and the count value of the counter 141 is "3" or "8".
makes the UP4 signal the logic 1 when the count value of the up/down counter 142 is "+3" and the count value of the counter 141 is "2", "5", or "8".

As described above, the UP4 signal and the DOWN4 signal output from the decoder 143 are set to be output at substantially equal intervals for each pattern length (10 clock cycles).

Next, the mixer 105 in FIG. 1 will be described. FIG. 9 is a table for explaining the logical configuration of the mixer 105. As shown in FIG. 9,
when the second control signal UP2 and the second control signal DOWN2 are both the logic 0 or the logic 1, the mixer outputs the value of the fourth control signal UP4 as the fifth control signal UP5 and the value of the fourth control signal DOWN4 as the fifth control signal DOWN5.
when the fourth control signal UP4 and the fourth control signal DOWN4 are both the logic 0 or the logic 1, the mixer outputs the value of the second control signal UP2 as the fifth control signal UP5 and the value of the second control signal DOWN 2 as and the fifth control signal DOWN5.
when the second control signal UP2 and the second control signal DOWN2 and the fourth control signal UP4 and the fourth control signal DOWN4 are all the logic 1, the mixer outputs the logic 0 as the fifth control signal UP5 and the fifth control signal DOWN5.
when the up signal UP2 of the second control signal and the up signal UP4 of the fourth control signal are both the logic 1, the mixer outputs the up signal UP5 of the fifth control signal as the logic 1 for two consecutive clocks, for example.
when the down signal DOWN2 of the second control signal and the down signal DOWN4 of the fourth control signal are both the logic 1, the mixer outputs the down signal DOWN5 of the fifth control signal as the logic 1 for two consecutive clocks, for example.
when the up signal UP2 of the second control signal and the down signal DOWN4 of the fourth control signal are both the logic 1, the mixer outputs the logic 0 as the fifth control signal UP5 and the fifth control signal DOWN5.
when the down signal DOWN2 of the second control signal and the up signal UP4 of the fourth control signal are both the logic 1, the mixer outputs the logic 0 as the fifth control signal UP5 and the fifth control signal DOWN5.

Next, the phase interpolator in FIG. 1 will be described. Four-phase clocks, each phase being equally spaced by 90-degree are supplied to the phase interpolator 106 in FIG. 1, for mixing. Then, the ratio of mixing is changed according to the fifth control signal UP5/DOWN5, thereby changing the phase of the output clock. The resolution of a phase change is set to sixty fourth of one clock period To. When the up signal UP5 of the input fifth control signal is the logic 1, the period of the synchronous clock, which is the output of the phase interpolator 106, is instantly reduced by its sixty fourth, so that the phase of the synchronous clock advances. On the contrary, when the down signal DOWN5 is the logic 1, the period of the synchronous clock, which is the output of the phase interpolator 106 is instantly increased by its sixty fourth, so that the phase of the synchronous clock is delayed.

As a circuit for blending the phases of input clocks, a known circuit (in the above Non-patent Documents 2 and 3 and Patent Document 2, for example) is employed.

Figure 11:
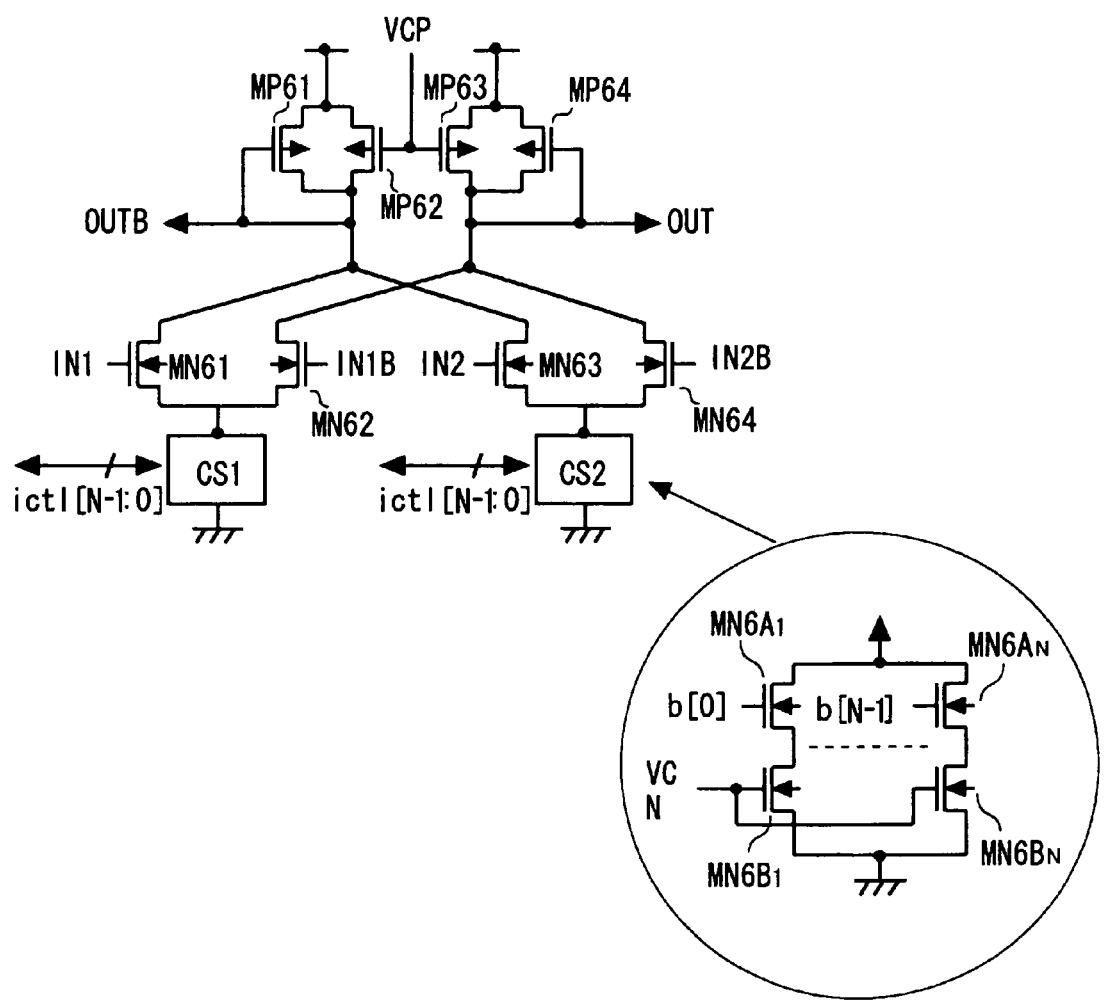
FIG. 11 is a diagram showing a configuration example of a phase interpolator employed in the embodiment of the present invention.

FIG. 11 is a diagram showing the configuration of a phase interpolator disclosed in the above Non-patent Document 2. Referring to FIG. 11, the phase interpolator includes NMOS transistors MN61, MN62 and NMOS transistors MN63, MN64. The NMOS transistors MN61 and MN62 constitute a first differential pair and have their sources tied together and connected to a first constant-current source CS1, receive respective ones of clocks IN1 and IN1B differentially at their gates and output respective ones of a pair of outputs thereof to one end of a first load (the common drain of parallel-connected PMOS transistors MP61 and MP62) and to one end of a second load (the common drain of parallel-connected PMOS transistors MP63 and MP64). The NMOS transistors MN63 and MN64 constitute a second differential pair and have their sources tied together and connected to a second constant-current source CS2, receive respective ones of clocks IN2 and IN2B differentially at their gates and have respective ones of a pair of outputs thereof connected to one end of the first load (the common drain of the PMOS transistors MP61 and MP62) and to one end of the second load (the common drain of the PMOS transistors MP63 and MP64). Outputs OUT and OUTB of phases that are a weighted sum of the two input clocks are. delivered from a commonly connected output pair of the first and second differential pairs. This phase interpolator is such that digital weighting codes ict1 (N-number of bits b[0] to b[N−1] in conformity with a phase resolution N, where 16 bits b[0] to b[15] are adopted in the above-mentioned reference) are supplied to the first and second constant-current sources CS1 and CS2. The current values of the first and second constant-current sources CS1 and CS2 can be varied (the number of constant-current sources $MN6B_1$ to $MN6B_N$ is selected by turning ON and OFF NMOS transistors $MN6A_1$ to $MN6A_N$ having N-number of bits b[0] to b[N−1] supplied to the gate terminals thereof) so that a conversion is made to the phase of the output clock signal. In FIG. 11, it is assumed that the current values of the constant-current sources $MN6B_1$ to $MN6B_N$ are the same.

In this case, based on the UP5 and DOWN 5 signals from the mixer 105 in FIG. 1, the phase interpolator 106 generates the output digital weighted code ict1 (thermometer code) to output the so generated ict1. Meanwhile, the active loads MP61 and MP62, and MP63 and MP64 may be replaced by resistances, respectively.

Figure 12:
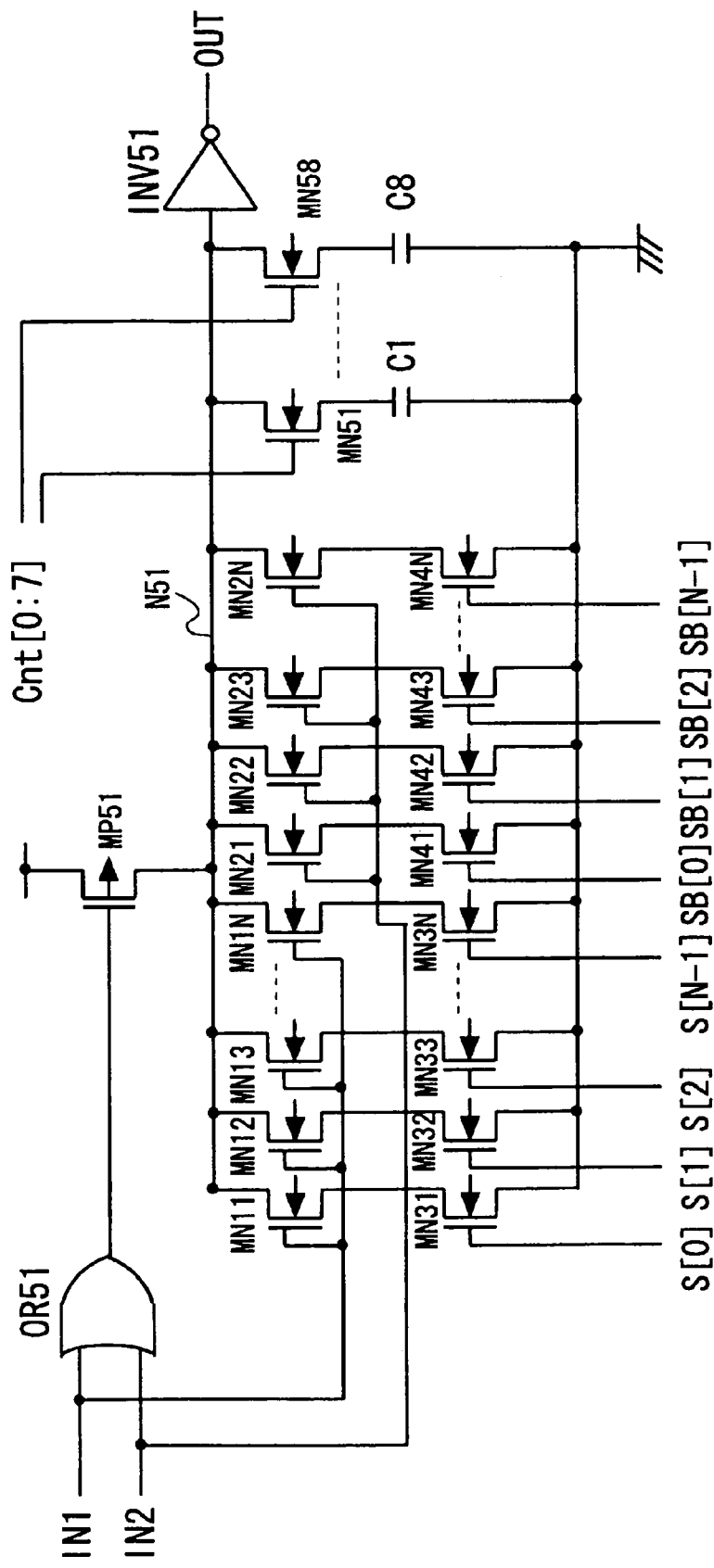
FIG. 12 is a diagram showing another configuration example of the phase interpolator employed in the embodiment of the present invention.
Figure 13:
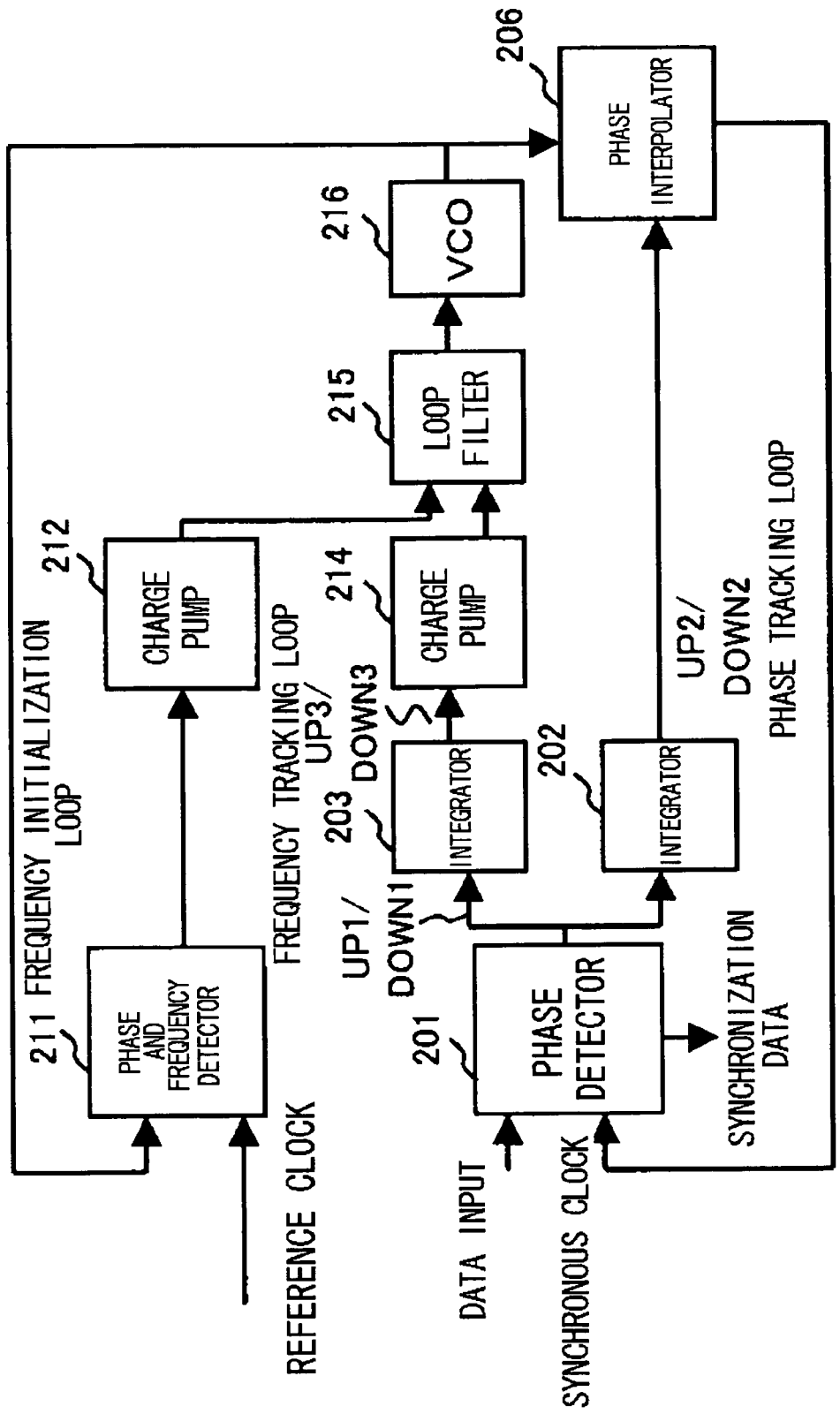
FIG. 13 is a diagram showing a configuration of a conventional clock and data recovery circuit.

Alternatively, the phase interpolator disclosed in the above Patent Document 2 or the like may be employed as the phase interpolator 106. FIG. 12 shows an example. The phase interpolator shown in FIG. 12 outputs an output clock having a delay corresponding to the amount of a phase obtained by internally dividing a phase difference between signals supplied to input terminals IN1 and IN2 by an internal division ratio defined by control signals S[0] to S[N−1], (where SB[0] to SB[N−1] are inverted signals of S[0] to S[N1]). More specifically, by variably setting the internal division ratio of the phase difference between the rising edges of the signals supplied to the input terminals IN1 and IN2, the phase of the output clock is adjusted. An outline of the circuit operation of the interpolator shown in FIG. 12 will be described. Through a PMOS transistor MP51 that receives the output of an OR circuit 51 at its gate when the signals supplied to the input terminals IN1 and IN2 are at low levels, a node N51 is charged. Among NMOS transistors MN31 to MN3N to the gates of which the control signals S[0] to S[N−1] are input at a rise of the signal supplied to the IN1, through paths of n NMOS transistors in the on state with their control signals being at high level, part of stored charges of the capacity of the node N51 are discharged. Then, among NMOS transistors MN41 to MN4N to the gates of which the control signals SB[0] to SB[N−1] are input at a rise of the signal supplied to the IN2 delayed from the rise of the signal supplied to the IN1, through the paths of (N-n) NMOS transistors in the on state with their control signals being at high level, and through N paths of n NMOS transistors in the on state among NMOS transistors MN31 to MN3N, stored charges of the capacity of the node N51 are discharged. When the voltage at the node N51 has become below its threshold value, the output of an inverter INV51 rises high from low. With this arrangement, the phase of the output clock is set variably, using an N-division of a phase difference T between the signal supplied to the IN1 and the signal supplied to the IN2 as a unit (T/N). Incidentally, the thermometer code is supplied to the S[0] to S[N−1].

According to this embodiment described above, by employing the phase interpolator 106 having a 1/64 resolution for 1.5 GHz clock and including one-to-two DEMUX circuits 117 and 118 in the phase detector 101, the pattern generator 104 operates at a 750 MHz clock.

In this case, the frequency of the synchronous clock, which is the output of the phase interpolator 106 becomes the highest when the fourth control signal UP4 output from the pattern generator 104 always becomes "1". On this occasion, the phase advances by 1/64 once in two 1.5 GHz clocks. Thus, the frequency of the synchronous clock becomes higher than 1.5 GHz by 1/(2×64)=0.78125%.

On the contrary, the frequency of the synchronous clock becomes the lowest when the fourth control signal DOWN4 output from the pattern generator 104 always becomes "1". Its frequency is reduced by 0.78125% than 1.5 GHz.

Hence, this embodiment can track a ±0.78125% SSC (Spread Spectrum Clock) modulation.

Further, in the clock and data recovery circuit according to this embodiment, power consumption of each channel is reduced by approximately 6 mW and its area can be reduced by approximately 10%, compared with a conventional circuit including the VCO.

Figure 10:
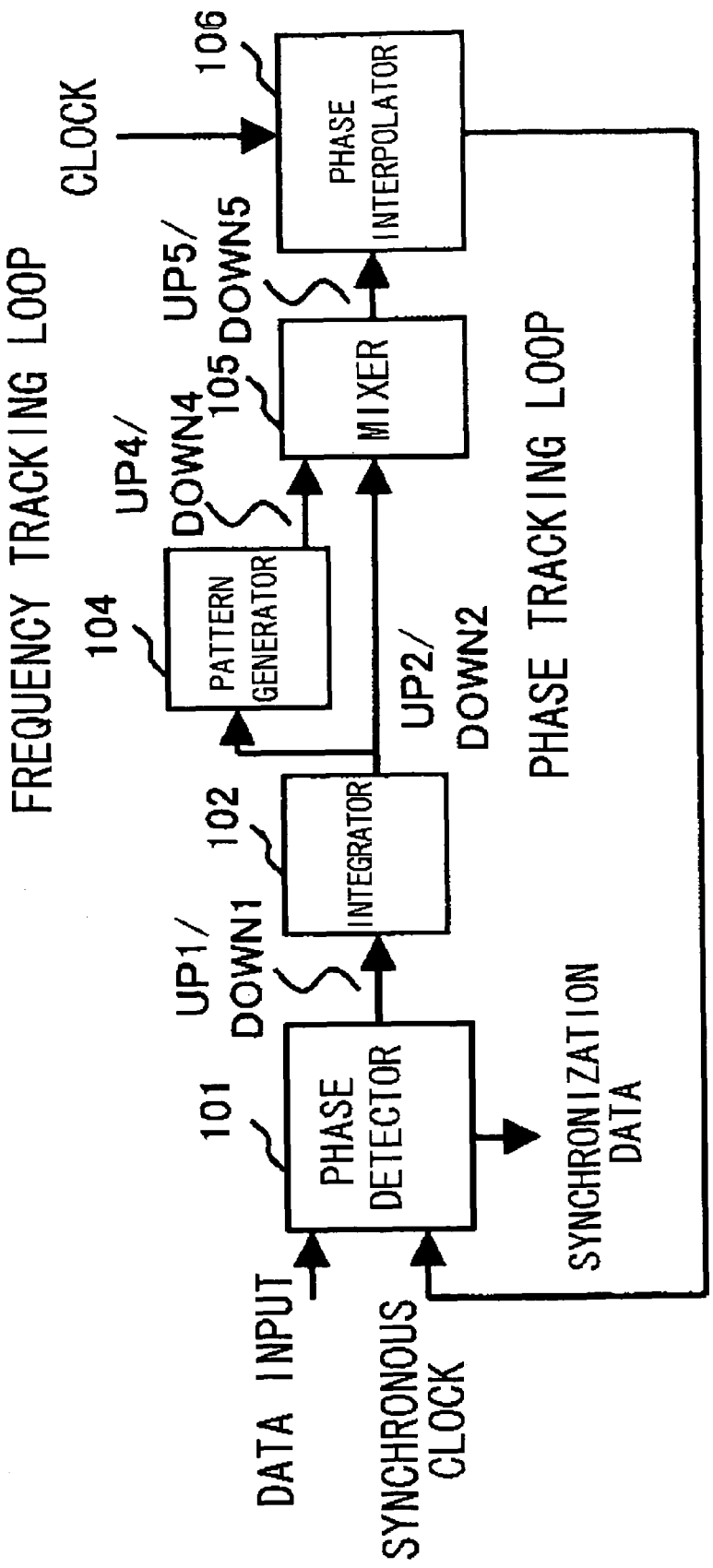
FIG. 10 is a diagram showing another embodiment of the present invention.

Next, a second embodiment of the present invention will be described. FIG. 10 is a diagram showing the second embodiment of the present invention. Referring to FIG. 10, in this embodiment, two integrators 102 and 103 in FIG. 1 are combined to one. That is, the integrator 102 is shared by the phase tracking loop and the frequency tracking loop. The pattern generator 104 inputs the second control signal UP2/DOWN2 from the integrator 102 to output the fourth control signal UP4/DOWN4. Other configurations are the same as those in the embodiment described before.

When the single integrator 102 is employed, it is preferable that the pattern length of the pattern generator 104 is set to be longer than that in the first embodiment described before. In this embodiment, the pattern length is set to "128". The counter 141 (refer to FIG. 7) of the pattern generator 104 repetitively (cyclically) counts "zero" to "127" for respective clocks according to the pattern length "128".

As described above, the present invention was described based on the embodiments described above. The present invention, however, is not limited to the configurations of the embodiments described above. It naturally includes various variations and modifications which could be performed by those skilled in the art within the range of the inventions in the claims.

The meritorious effects of the present invention are summarized as follows.

As described above, according to the present invention, the control signal for the phase interpolator is generated, based on the result of phase detection in the phase tracking loop and the output of the pattern generator in the frequency tracking loop. Tracking of frequency-modulated input data can be thereby performed without provision of the VCO. Reduction in circuit size, chip size, and current consumption thus can be effected.

Further, according to the present invention, by performing serial-to-parallel conversion of a phase detection signal by the phase detector, reduction in the operation speeds of the circuits in subsequent stages becomes possible. A faster operation speed of the circuit thus can be accommodated.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock and data recovery circuit having a frequency tracking loop and a phase tracking loop, said clock and data recovery circuit comprising:
    a phase detector comparing a phase of an input data signal with a phase of a synchronous clock signal;
    a phase interpolator receiving an input clock signal and a control signal, adjusting a phase of an output clock signal based on the control signal, and supplying the output clock signal to said phase detector as the synchronous clock signal, said phase detector and said phase interpolator owned in common by said frequency tracking loop and said phase tracking loop;
    a pattern generator generating a signal for variably setting the phase of the output clock signal from said phase interpolator based on a result of phase comparison by said phase detector and outputting the so generated signal, said pattern generator provided in said frequency tracking loop; and
    a circuit generating the control signal to said phase interpolator based on a result of phase detection by said phase tracking loop and said outputted signal of said pattern generator in said frequency tracking loop.

2. A clock and data recovery circuit comprising:
    a phase detector receiving a data signal and a synchronous clock signal and comparing phases of the synchronous clock signal and the data signal and outputting a result of phase comparison;
    a phase interpolator receiving an input clock signal and a control signal and variably adjusting a phase of an output clock signal;
    a pattern generator receiving an integrated value of the result of the phase comparison from said phase detector and generating and outputting a signal for variably setting the phase of the output clock signal of said phase interpolator, said pattern generator provided in a frequency tracking loop; and
    a mixer generating a signal obtained by mixing the integrated value in a phase tracking loop with said outputted signal of said pattern generator in said frequency tracking loop, said phase tracking loop controlling the phase of the output clock signal from said phase interpolator in accordance with the integrated value of the result of the phase comparison by said phase detector; the mixer supplying the generated signal to said phase interpolator as the control signal;
    the output clock signal from said phase interpolator being fed back to said phase detector as the synchronous clock signal.

3. The clock and data recovery circuit according to claim 2, wherein said phase tracking loop and said frequency tracking loop share an integrator for integrating the result of the phase comparison by said phase detector.

4. The clock and data recovery circuit according to claim 2, wherein when one of said phase tracking loop and said frequency tracking loop is in a stabilized state, said mixer outputs a control signal for adjusting the phase of the output clock signal of said phase interpolator based on the result of the phase comparison by the other loop.

5. The clock and data recovery circuit according to claim 2, wherein said mixer comprises a circuit for outputting a control signal for advancing the phase of the output clock signal of said phase interpolator for predetermined consecutive clock cycles when the result of the phase comparison in said phase tracking loop and the output signal of said pattern generator in said frequency tracking loop both indicate up, and outputting a control signal for delaying the phase of the output clock signal of said phase interpolator for predetermined consecutive clock cycles when the result of the phase comparison in said phase tracking loop and the output signal of said pattern generator in said frequency tracking loop both indicate down.

6. A clock and data recovery circuit comprising:
    a phase detector receiving a data signal and a synchronous clock signal, comparing phases of the received two signals to detect a delay and an advance, and outputting a first control signal according to a result of the detection;
    a first integrator receiving the first control signal output from said phase detector and integrating the received first control signal to output a resultant signal as a second control signal;
    a second integrator receiving the first control signal output from said phase detector and integrating the received first control signal to output a resultant signal as a third control signal;
    a pattern generator receiving the third control signal from said second integrator, counting the received third control signal and outputting a fourth control signal based on a result of the counting;
    a mixer receiving the second control signal from said first integrator and the fourth control signal from said pattern generator and generating a fifth control signal based on the second control signal and the fourth control signal, for output; and
    a phase interpolator receiving an input clock signal and the fifth control signal from said mixer, and adjusting a phase of an output clock signal based on the fifth control signal; the output clock signal from said phase interpolator being fed back to said phase detector as the synchronous clock.

7. A clock and data recovery circuit comprising:
    a phase detector receiving a data signal and a synchronous clock signal, comparing phases of the received two signals to detect a delay and an advance, and outputting a first control signal according to a result of the detection;
    an integrator receiving the first control signal output from said phase detector and integrating the received first control signal to output a resultant signal as a second control signal;

a pattern generator receiving the second control signal from said integrator, counting the received second control signal and outputting a third control signal based on a result of the counting;

a mixer receiving the second control signal from said integrator and the third control signal from said pattern generator, and generating a fourth control signal based on the second control signal and the third control signal to output the so generated fourth control signal; and a phase interpolator receiving an input clock signal and the fourth control signal from said mixer and then adjusting a phase of an output clock signal based on the fourth control signal;

the output clock signal from said phase interpolator being fed back to said phase detector as the synchronous clock signal.

8. The clock and data recovery circuit according to claim 6, wherein each of the first through fifth control signals includes an up signal indicating an advance in phase and a down signal indicating a delay in phase.

9. The clock and data recovery circuit according to claim 7, wherein each of the first thorough fourth control signals includes an up signal indicating an advance in phase and a down signal indicating a delay in phase.

10. The clock and data recovery circuit according to claim 6, wherein said pattern generator comprises:

a first counter receiving the input clock signal and repetitively counting from zero to a predetermined first count value as a count value;

a second counter receiving the input clock signal and performing counting up and counting down when the third control signal indicates up and down respectively; and a decoder receiving count outputs from said first counter and said second counter and outputting the fourth control signal based on the count outputs.

11. The clock and data recovery circuit according to claim 7, wherein said pattern generator comprises:

a first counter receiving the input clock signal and repetitively counting from zero to a predetermined first count value as a count value;

a second counter receiving the input clock signal and performing counting up and counting down when the second control signal indicates up and down respectively; and a decoder receiving count outputs from said first counter and said second counter and outputting the third control signal based on the count outputs.

12. The clock and data recovery circuit according to claim 10, wherein said decoder includes a circuit for outputting an up signal or a down signal of the fourth control signal at an equal interval or at an interval made close to an equal interval, during a period of cycles corresponding in number to the first count value of said first counter.

13. The clock and data recovery circuit according to claim 11, wherein said decoder includes a circuit for outputting an up signal or a down signal of the third control signal at an equal interval or at an interval made close to an equal interval, during a period of cycles corresponding in number to the first count value of said first counter.

14. The clock and data recovery circuit according to claim 10, wherein said decoder receives the count outputs of said first counter and said second counter, decodes the received count outputs and outputs up and down signals as the fourth control signal; and said decoder includes a circuit for performing control so as to output the up signal a number of times corresponding to the count value of said second counter during cycles corresponding in number to the first count value of said first counter when the count value of said second counter is positive, to output the down signal a number of times corresponding to the count value of said second counter during the cycles corresponding in number to the first count value of said first counter when the count value of said second counter is negative, and not to output the up signal and the down signal during the cycles corresponding in number to the first count value of said first counter when the count value of said second counter is zero.

15. The clock and data recovery circuit according to claim 11, wherein said decoder receives the count outputs of said first counter and said second counter, decodes the received count outputs and outputs up and down signals as the third control signal; and said decoder includes a circuit for performing control so as to output the up signal a number of times corresponding to the count value of said second counter during cycles corresponding in number to the first count value of said first counter when the count value of said second counter is positive, to output the down signal a number of times corresponding to the count value of said second counter during the cycles corresponding in number to the first count value of said first counter when the count value of said second counter is negative, and not to output the up signal and the down signal during the cycles corresponding in number to the first count value of said first counter when the count value of said second counter is zero.

16. The clock and data recovery circuit according to claim 6, wherein said mixer outputs values of an up signal and a down signal of the fourth control signal as an up signal and a down signal of the fifth control signal, respectively, when an up signal and a down signal of the second control signal are both inactive or both active;

said mixer outputs values of the up signal and the down signal of the second control signal as the up signal and the down signal of the fifth control signal, respectively, when the up signal and the down signal of the fourth control signal are both inactive or both active;

said mixer activates the up signal of the fifth control signal, for output, for predetermined consecutive clocks when the up signals of the second and fourth control signals are both active; and said mixer activates the down signal of the fifth control signal for the predetermined consecutive clocks when the down signals of the second and fourth control signals are both active.

17. The clock and data recovery circuit according to claim 16, wherein the mixer outputs the up signal and the down signal of the fifth control signal in inactivated states when the up signal of the second control signal and the down signal of the fourth control signal are both active; and the mixer outputs the up signal and the down signal of the fifth control signal in inactivated states when the down signal of the second control signal and the up signal of the fourth control signal are both active.

18. The clock and data recovery circuit according to claim 7, wherein said mixer outputs values of an up signal and a down signal of the third control signal as an up signal and a down signal of the fourth control signal when an up signal and a down signal of the second control signal are both inactive or both active;

said mixer outputs values of the up signal and the down signal of the second control signal as the up signal and the down signal of the fourth control signal when the up signal and the down signal of the third control signal are both inactive or both active;

said mixer activates the up signal of the fourth control signal, for output for predetermined consecutive clocks when the up signals of the second and third control signals are both active; and said mixer activates the down signal of the fourth control signal, for output for the predetermined consecutive clocks when the down signals of the second and third control signals are both active.

19. The clock and data recovery circuit according to claim 18, wherein the mixer outputs the up signal and the down signal of the fourth control signal in inactivated states when the up signal of the second control signal and the down signal of the third control signal are both active; and the mixer outputs the up signal and the down signal of the fourth control signal in inactivated states when the down signal of the second control signal and the up signal of the third control signal are both active.

20. The clock and data recovery circuit according to claim 1, wherein said phase detector comprises a circuit performing serial-to-parallel conversation of the result of the phase comparison and then outputting the result of the phase comparison.

21. The clock and data recovery circuit according to claim 2, wherein said phase detector comprises a circuit performing serial-to-parallel conversation of the result of the phase comparison and then outputting the result of the phase comparison.

22. The clock and data recovery circuit according to claim 6, wherein said phase detector comprises a circuit performing serial-to-parallel conversation of the result of the phase comparison and then outputting the result of the phase comparison.

23. The clock and data recovery circuit according to claim 7, wherein said phase detector comprises a circuit performing serial-to-parallel conversation of the result of the phase comparison and then outputting the result of the phase comparison.

24. The clock and data recovery circuit according to claim 1, wherein said phase detector comprises:
   a first sampling circuit for sampling the input data signal by the synchronous clock signal;
   a second sampling circuit for sampling the input data signal by a complementary signal of the synchronous clock signal;
   a third sampling circuit for sampling an output of said first sampling circuit by the synchronous clock signal;
   a fourth sampling circuit for sampling an output of said second sampling circuit by the synchronous clock signal;
   a first coincidence detection circuit for detecting a coincidence between the output of said first sampling circuit and an output of said fourth sampling circuit; and
   a second coincidence detection circuit for detecting a coincidence between an output of said third sampling circuit and the output of said fourth sampling circuit.

25. The clock and data recovery circuit according to claim 2, wherein said phase detector comprises:
   a first sampling circuit for sampling the input data signal by the synchronous clock signal;
   a second sampling circuit for sampling the input data signal by a complementary signal of the synchronous clock signal;
   a third sampling circuit for sampling an output of said first sampling circuit by the synchronous clock signal;
   a fourth sampling circuit for sampling an output of said second sampling circuit by the synchronous clock signal;
   a first coincidence detection circuit for detecting a coincidence between the output of said first sampling circuit and an output of said fourth sampling circuit; and
   a second coincidence detection circuit for detecting a coincidence between an output of said third sampling circuit and the output of said fourth sampling circuit.

26. The clock and data recovery circuit according to claim 6, wherein said phase detector comprises:
   a first sampling circuit for sampling the input data signal by the synchronous clock signal;
   a second sampling circuit for sampling the input data signal by a complementary signal of the synchronous clock signal;
   a third sampling circuit for sampling an output of said first sampling circuit by the synchronous clock signal;
   a fourth sampling circuit for sampling an output of said second sampling circuit by the synchronous clock signal;
   a first coincidence detection circuit for detecting a coincidence between the output of said first sampling circuit and an output of said fourth sampling circuit; and
   a second coincidence detection circuit for detecting a coincidence between an output of said third sampling circuit and the output of said fourth sampling circuit.

27. The clock and data recovery circuit according to claim 7, wherein said phase detector comprises:
   a first sampling circuit for sampling the input data signal by the synchronous clock signal;
   a second sampling circuit for sampling the input data signal by a complementary signal of the synchronous clock signal;
   a third sampling circuit for sampling an output of said first sampling circuit by the synchronous clock signal;
   a fourth sampling circuit for sampling an output of said second sampling circuit by the synchronous clock signal;
   a first coincidence detection circuit for detecting a coincidence between the output of said first sampling circuit and an output of said fourth sampling circuit; and
   a second coincidence detection circuit for detecting a coincidence between an output of said third sampling circuit and the output of said fourth sampling circuit.

28. The clock and data recovery circuit according to claim 24, further comprising:
   a first serial-to-parallel conversion circuit for performing serial-to-parallel conversion of an output of said first coincidence detection circuit;
   a second serial-to-parallel conversion circuit for performing serial-to-parallel conversion of an output of said second coincidence detection circuit;
   a first logic circuit for multiplexing parallel outputs of said first serial-to-parallel conversion circuit into a single output;
   a second logic circuit for multiplexing parallel outputs of said second serial-to-parallel conversion circuit into a single output;
   a third logic circuit for generating a down signal indicating the result of the phase comparison based on a first output and an inverse signal of a second output of two outputs of said first and second logic circuits; and
   a fourth logic circuit for generating an up signal indicating the result of the phase comparison based on an inverse signal of the first output and the second output of the two outputs of said first and second logic circuits.

29. The clock and data recovery circuit according to claim 1, wherein said phase detector comprises:
- a first group of sampling circuits for sampling the input data signal by the synchronous clock comprising multi-phase synchronous clocks having mutually different phases;
- a second group of sampling circuits for sampling outputs of said first group of sampling circuits by one of the multi-phase synchronous clocks; and
- a decoder circuit for receiving a plurality of output signals from said second group of sampling circuits, determining a phase delay or a phase advance of the input data signal with respect to the synchronous clock signal from a change point in values of the plurality of output signals, and outputting an up signal and a down signal.

30. The clock and data recovery circuit according to claim 2, wherein said phase detector comprises:
- a first group of sampling circuits for sampling the input data signal by the synchronous clock comprising multi-phase synchronous clocks having mutually different phases;
- a second group of sampling circuits for sampling outputs of said first group of sampling circuits by one of the multi-phase synchronous clocks; and
- a decoder circuit for receiving a plurality of output signals from said second group of sampling circuits, determining a phase delay or a phase advance of the input data signal with respect to the synchronous clock signal from a change point in values of the plurality of output signals, and outputting an up signal and a down signal.

31. The clock and data recovery circuit according to claim 6, wherein said phase detector comprises:
- a first group of sampling circuits for sampling the input data signal by the synchronous clock comprising multi-phase synchronous clocks having mutually different phases;
- a second group of sampling circuits for sampling outputs of said first group of sampling circuits by one of the multi-phase synchronous clocks; and
- a decoder circuit for receiving a plurality of output signals from said second group of sampling circuits, determining a phase delay or a phase advance of the input data signal with respect to the synchronous clock signal from a change point in values of the plurality of output signals, and outputting an up signal and a down signal.

32. The clock and data recovery circuit according to claim 7, wherein said phase detector comprises:
- a first group of sampling circuits for sampling the input data signal by the synchronous clock comprising multi-phase synchronous clocks having mutually different phases;
- a second group of sampling circuits for sampling outputs of said first group of sampling circuits by one of the multi-phase synchronous clocks; and
- a decoder circuit for receiving a plurality of output signals from said second group of sampling circuits, determining a phase delay or a phase advance of the input data signal with respect to the synchronous clock signal from a change point in values of the plurality of output signals, and outputting an up signal and a down signal.

33. The clock and data recovery circuit according to claim 6, wherein said first and second integrators include respective up/down counters for performing counting up or down when a result of phase comparison from said phase detector indicates up or down,
- outputting an up signal as the second control signal and the third control signal in response to a next clock when the result of the phase comparison indicates up and a count value thereof is an upper limit value, and initializing the count value, and
- outputting a down signal as the second control signal and the third control signal in response to the next clock when the result of the phase comparison from said phase detector indicates down and the count value thereof is a lower limit value, and initializing the count value.

34. The clock and data recovery circuit according to claim 7, wherein said integrator includes an up/down counter for performing counting up or down when a result of phase comparison from said phase detector indicates up or down,
- outputting an up signal as the second control signal in response to a next clock when the result of the phase comparison indicates up and a count value thereof is an upper limit value, and initializing the count value, and
- outputting a down signal as the second control signal in response to the next clock when the result of the phase comparison from said phase detector indicates down and the count value thereof is a lower limit value, and initializing the count value.

35. The clock and data recovery circuit according to claim 1, wherein said phase interpolator includes a circuit for performing control such that the phase of the output clock signal is delayed or the phase of the output clock signal is advanced based on the control signal, using a predetermined resolution for a period of the input clock signal as a unit.

36. The clock and data recovery circuit according to claim 2, wherein said phase interpolator includes a circuit for performing control such that the phase of the output clock signal is delayed or the phase of the output clock signal is advanced based on the control signal, using a predetermined resolution for a period of the input clock signal as a unit.

37. The clock and data recovery circuit according to claim 6, wherein said phase interpolator includes a circuit for performing control such that the phase of the output clock signal is delayed or the phase of the output clock signal is advanced based on the control signal, using a predetermined resolution for a period of the input clock signal as a unit.

38. The clock and data recovery circuit according to claim 7, wherein said phase interpolator includes a circuit for performing control such that the phase of the output clock signal is delayed or the phase of the output clock signal is advanced based on the control signal, using a predetermined resolution for a period of the input clock signal as a unit.

39. The clock and data recovery circuit according to claim 35, wherein said phase interpolator receives a spread spectrum clock signal with frequency thereof varied within a predetermined frequency range as the input clock signal.

40. The clock and data recovery circuit according to claim 35, wherein said phase interpolator receives a clock signal of a predetermined fixed frequency is input as the input clock signal.

* * * * *